US012232225B2

(12) United States Patent
Kachelhoffer et al.

(10) Patent No.: US 12,232,225 B2
(45) Date of Patent: Feb. 18, 2025

(54) ELECTRIC HEATING DEVICE (71) Applicant: Eberspächer catem GmbH & Co. KG, Herxheim (DE)

(72) Inventors: Patrick Kachelhoffer, Seebach (FR); Daniela Weber, Winden (DE)

(73) Assignee: Eberspächer catem GmbH & Co. KG, Herxheim (DE)

( * ) Notice: Subject to any disclaimer, the term of this patent is extended or adjusted under 35 U.S.C. 154(b) by 834 days.

(21) Appl. No.: 17/363,642

(22) Filed: Jun. 30, 2021

(65) Prior Publication Data
US 2022/0007465 A1 Jan. 6, 2022

(30) Foreign Application Priority Data

Jul. 1, 2020 (DE) ...................... 10 2020 117 366.0

(51) Int. Cl.
| H05B 3/06 | (2006.01) |
| H05B 1/02 | (2006.01) |
| H05B 3/00 | (2006.01) |
| H05B 7/20 | (2006.01) |
| H05K 7/20 | (2006.01) |

(52) U.S. Cl.
CPC ................. H05B 3/06 (2013.01); H05B 1/02 (2013.01); H05B 3/0014 (2013.01); H05K 7/2039 (2013.01); H05B 2203/016 (2013.01); H05B 2203/02 (2013.01)

(58) Field of Classification Search
None
See application file for complete search history.

(56) References Cited

U.S. PATENT DOCUMENTS

| 4,972,294 | A | 11/1990 | Moses, Jr. et al. |
| 5,705,850 | A | 1/1998 | Ashiwake et al. |
| 5,917,701 | A | 6/1999 | Solberg |
| 9,291,362 | B2 * | 3/2016 | Bohlender .............. F24H 3/047 |
| 9,297,551 | B2 * | 3/2016 | Bohlender ............... H05B 3/50 |
| 9,326,324 | B2 * | 4/2016 | Bohlender ............... H05B 3/50 |

(Continued)

FOREIGN PATENT DOCUMENTS

| CN | 103179701 A | 6/2013 |
| CN | 205902279 U | 1/2017 |

(Continued)

Primary Examiner — Dana Ross
Assistant Examiner — Kuangyue Chen
(74) Attorney, Agent, or Firm — Boyle Fredrickson S.C.

(57) ABSTRACT

An electric heating device includes an electric control device with a control housing that is in structural unity with a housing of a power section. The power section has a frame forming a heating chamber. At least one PTC heating device with at least one PTC element and conductor elements is provided in the heating chamber. The control housing forms a chamber which is separated from the frame by a partition wall. A heat sink projects from the partition wall into the power section. The electric control device has a printed circuit board and at least one power switch which generates a power loss and which is connected in a heat-conducting manner to a surface of a heat sink. An electrically insulating layer and a spring element, which holds the power switch applied under pretension against the surface of the heat sink, are provided between the power switch and the heat sink.

19 Claims, 5 Drawing Sheets (56) References Cited

U.S. PATENT DOCUMENTS

| | | | |
|---|---|---|---|
| 9,338,831 B2 * | 5/2016 | Bohlender | H05B 3/30 |
| 9,398,641 B2 * | 7/2016 | Bohlender | H05B 3/02 |
| 2013/0163969 A1 * | 6/2013 | Bohlender | F24H 3/062 |
| | | | 392/465 |
| 2018/0156493 A1 | 6/2018 | Bohlender et al. | |
| 2024/0015853 A1 * | 1/2024 | Niederer | H05B 1/0244 |
| 2024/0130064 A1 * | 4/2024 | Fine | H05K 1/0201 |

FOREIGN PATENT DOCUMENTS

| | | | |
|---|---|---|---|
| CN | 110364497 A | 10/2019 | |
| CN | 210432016 U | 4/2020 | |
| DE | 19811603 | 9/1998 | |
| DE | 10 2005 002 812 | 8/2006 | |
| EP | 1253808 | 10/2002 | |
| EP | 2337425 | 6/2011 | |
| EP | 2607121 | 6/2013 | |
| EP | 2637474 | 9/2013 | |
| JP | 2019212809 A | 12/2019 | |
| KR | 1020100112035 | 10/2010 | |

* cited by examiner

ELECTRIC HEATING DEVICE

BACKGROUND OF THE INVENTION

1. Field of the Invention

The present invention relates to an electric heating device, in particular for a motor vehicle with an electric control device. The electric control device of the electric heating device has, in a manner known, a printed circuit board and at least one power switch which is connected in a heat-conducting manner to a surface of a heat sink. Such an electric heating device is known, for example, from EP 2 607 121 A1, which originates from the present applicant.

2. Background of the Invention

The intended use of the electric heating device described therein also applies to the present invention. Thus, the electric control device according to the invention is in particular a component of an electric heating device and is located in a control housing, which is provided in constructional unity with a housing to a power section, which has a frame with opposing frame openings for the passage of a medium to be heated. The frame is separated from a chamber formed in the control housing by a partition wall, from which at least one cooling element usually forming the heat sink projects into the frame. The frame forms a heating chamber, in which PTC heating devices with at least one PTC element and conducting elements for energizing the same with different polarity adjacent thereto are provided. The heat generated by the PTC element is transferred within the frame and the thus formed heating chamber to a fluid to be heated. The fluid may be a liquid fluid or a gaseous fluid. Thus, the electric heating device with the control device according to the invention can also be configured according to EP 2 637 474 A1 or EP 2 337 425 A1.

The aforementioned electric heating devices, the details of which may also be essential to the present invention, conduct a fluid loaded with moisture and/or contamination or a liquid fluid which is heated in the heating chamber. The at least one PTC element is occasionally operated with high-voltage current, in particular for heating a fluid in an electrically operated motor vehicle. This is switched within the control housing, in which the control device is usually located. Thus, this high-voltage current is also applied to the power transistor.

The aforementioned prior art suggests to pass through the heat sink from the control housing into the heating chamber in a sealed manner so that the power switch can be in heat conductive contact in the control housing indirectly or directly against the surface formed by the heat sink, while at the same time the sealing prevents the medium to be heated from reaching the control housing.

In a direct application of the power switch to the surface, the power switch is in direct contact with the surface. In an indirect application, an electrically insulating foil is located between the power switch and the surface of the heat sink, which is usually not only a good heat-conducting surface but also an electrically conductive surface.

Such a dissipation of the power loss generated by the power switch to the heat sink is known from KR 10 2010 011 2035 A. However, this prior art lacks a seal between the heat sink and the interior of the control housing.

The aforementioned prior art EP 2 607 121 A1 is based on the attempt to apply the power switch with a certain pretension against the surface of the heat sink despite changing operating and temperature conditions so that good heat dissipation can be reliably achieved at any time. For this purpose, a sealing element sealing the heat sink in the partition wall is intended to apply the heat sink in the direction of the power switch and with the interposition of an insulating foil. In another prior art known from EP 1 253 808 A1, the power switch together with the heat sink is encompassed by a C-shaped spring element so that the heat sink is pretensioned against the power switch for good dissipation of the power loss.

As mentioned above, the electric heating device according to the present invention is usually used in a motor vehicle. The components installed in a vehicle are subjected to considerable vibration. Moreover, the climatic conditions under which the individual components of a vehicle are used vary. In an electric control device of the type mentioned above, however, it must be ensured that the power dissipated by the power switch is reliably transferred to the heat sink at any time.

SUMMARY

The present invention aims to specify an electric heating device that reliably ensures dissipation of the power loss generated by the power switch to the surface of the heat sink.

To solve this problem, the present invention suggests that an electrical insulating layer and a spring element are provided between the power switch and the heat sink to hold the power switch pretensioned against the surface of the heat sink.

In the solution according to the invention, the electrical insulating layer and the spring element are then located in the heat conduction path between the power switch and the heat sink. The spring element is therefore not only a mechanism for elastically contacting the power switch against the surface of the heat sink. Rather, the spring element also serves simultaneously as a heat-conducting body that dissipates the power loss generated by the power switch in the direction of the heat sink. The spring element usually has at least one spring segment that is elastically deformable as a spring arm to generate the pretension and maintains the heat-conducting and pretensioned contact of the power switch against the heat sink over a certain spring path.

The electrical insulating layer can be formed by a Kapton foil in a manner known. The electrical insulating layer can be provided between the spring element and the power switch or between the power switch and the surface of the heat sink. The spring element is supported on one side of the electrical insulating layer.

The heat sink can be formed in a known manner by a cooling element which is acquired as a separate component in the partition wall and connected to it. Such a cooling element can also be sealed toward the partition wall to prevent moisture or contamination from entering the control housing from the heating chamber. The heat sink may also be integrally formed by the partition wall or at least by a major portion thereof. The control housing may be formed in whole or in part of metal and provided with a configuration that increases the cooling surface. In this case, the heat sink is formed by the control housing itself, in particular by those parts of the control housing that separate the heating chamber from the interior of the control housing.

Also with regard to the best possible EMC shielding, the control housing and thus also the partition wall may be formed from a material with good heat conductivity in particular a metal.

In view of reducing the thermal resistivity in the heat conduction path from the power switch to the surface of the heat sink, according to an embodiment of the present invention, it is proposed to form the spring element from a spring material having good heat conductive properties. A material with good heat conductivity in this sense usually has a heat conductivity of at least 50 watt/(m K). It has been shown that, in particular, a spring element formed from copper-beryllium provides both, good heat conductivity as well as sufficient permanently elastic properties. Thus, the spring element may be formed from a metal which is exclusively or at least predominantly formed from copper and beryllium.

According to a further development of the present invention, a form-fit segment is provided which is connected to the surface of the heat sink and positively limits the movability of the electrical insulating layer and/or the spring element in a direction transverse to a force-acting direction of the pretensioning force caused by the spring element. The direction of action of the pretensioning force, i.e. of the spring element, is usually at right angles to the surface of the heat sink or a surface of the power switch through which the power loss is dissipated. The corresponding surfaces usually extend parallel to each other. The spring element projects at right angles from these surfaces.

The form-fit segment, which limits the movability of the electrical insulating layer or the spring element, can be connected to the heat sink or be formed integrally with the area forming the surface of the heat sink. The form-fit segment may be a trough-shaped configuration within which the spring element or the electrical insulating layer is located. In this case, the electrical insulating layer or the spring element is usually located in a trough bounded by walls which projects beyond the surface of the heat sink for transmitting the pretensioning force of the spring in the direction of the power switch.

According to a further development of the present invention, the insulating layer is formed by an insulating form-fit element held positively on the surface of the heat sink. This insulating form-fit element can be located within the form-fit segment connected to the heat sink, so that the movement of the insulating form-fit element transverse to the direction of action of the pretensioning force of the spring element is only movable within limits on the surface of the heat sink. According to this further development, the insulating form-fit element abuts the surface of the heat sink and has insulating walls which project in the direction of the power switch and at least partially cover the spring element in this direction. Thus, the spring element can be formed from an electrically conductive material without the risk of the latter coming into direct contact with the surface of the heat sink and/or the insulating walls connected thereto in accordance with the further development discussed above. The insulating walls limit the movability of the spring element transversely to the pretensioning direction of the spring element. Thus, the spring element is only movable within limits transverse to its pretensioning direction.

The further development discussed above may also be realized on the power switch.

The movability can be selected so that the spring element can only be displaced within limits relative to the power switch. According to a further development of the present invention, the spring element is not firmly connected to a contact surface of the power switch. Rather, manufacturing tolerances, positional changes due to the spring path and heat expansions between the spring element and the power switch or the printed circuit board can be compensated for by relative movement transverse to the direction of action of the force of the spring element. Accordingly, the contact surface of the spring element is slidable relative to the power switch, but is usually in direct contact with it.

In particular with regard to the further development discussed above, the contact surface of the power switch projects beyond the printed circuit board in the direction of, or toward, the heat sink. The surface projected by the power switch is usually the underside of the printed circuit board, which is not equipped with electronic components.

In an alternative configuration of the present invention, the contact surface of the spring element is firmly connected to the power switch. In this configuration, manufacturing tolerances and heat expansions or a possibly varying compression of the spring element as a result are compensated for by relative movement on the side opposite the power switch. Thus, the insulating layer and/or the spring element can perform compensating movements relative to the surface of the heat sink.

In this alternative, the spring element can be located at least partially in a bore of the printed circuit board and is accommodated therein. The bore and the dimension of the spring element are usually selected so that the spring element is fitted into the bore of the printed circuit board in a direction transverse to the pretensioning force of the spring element.

According to a still further development of the present invention, the spring element has at least two spring segments. These spring segments form free ends which are usually slidable on the insulating layer. The spring segments are configured such that a height-related distance between the printed circuit board and the surface of the heat sink can be compensated for by elastic deformation of the spring segments. The resulting change in distance between the free ends of the spring segments leads to a relative movement between the spring segments and the insulating layer. In a side view, the spring element may be co-formed in a U- or V-shape, with the two spring segments generally forming the legs of the U or V, respectively.

In the configuration according to the invention, the power switch is usually applied against the spring element by a pressure element on the side opposite the heat sink. The pressure element can penetrate the printed circuit board completely or partially, provided that the power switch is provided on the side opposite the pressure element with respect to the printed circuit board, as is known in principle from EP 2 607 121 B1. The pressure element may be integrally connected to or with the control housing. This configuration of the present invention can also comply with the specifications according to EP 2 607 121 A1.

The aforementioned spring segments can each lie in one plane. Several of such spring segments can be provided one behind the other in the manner of a stack. It is understood that the spring segments are usually part of a unitary spring element formed from a sheet material by stamping and bending. Likewise, a plurality of spring segments may project radially from a common base of the spring element, through which a contact surface of the spring element is formed, against which the power switch abuts. In a side view, opposing spring elements usually form U-shaped segments in such a configuration. These can be slightly exposed radially outwards and abut the insulating layer with a convex support surface formed by bending.

BRIEF DESCRIPTION OF THE DRAWINGS

Further details and advantages of the present invention will be apparent from the following description of embodiments in conjunction with the drawings. Therein:

FIG. 1 shows an embodiment of an electric heating device with a power section 2 and a control device 4, which are each accommodated in different housings. For this purpose, the power section 2 has a frame 6 divided into two parts and forming a heating chamber 7, in which a heating block 8 with a plurality of PTC heating devices 10 and corrugated rib elements 12 adjacent thereto on both sides is accommodated. Details of each PTC heating device 10 are shown in FIG. 6.

DETAILED DESCRIPTION

Figure 1:
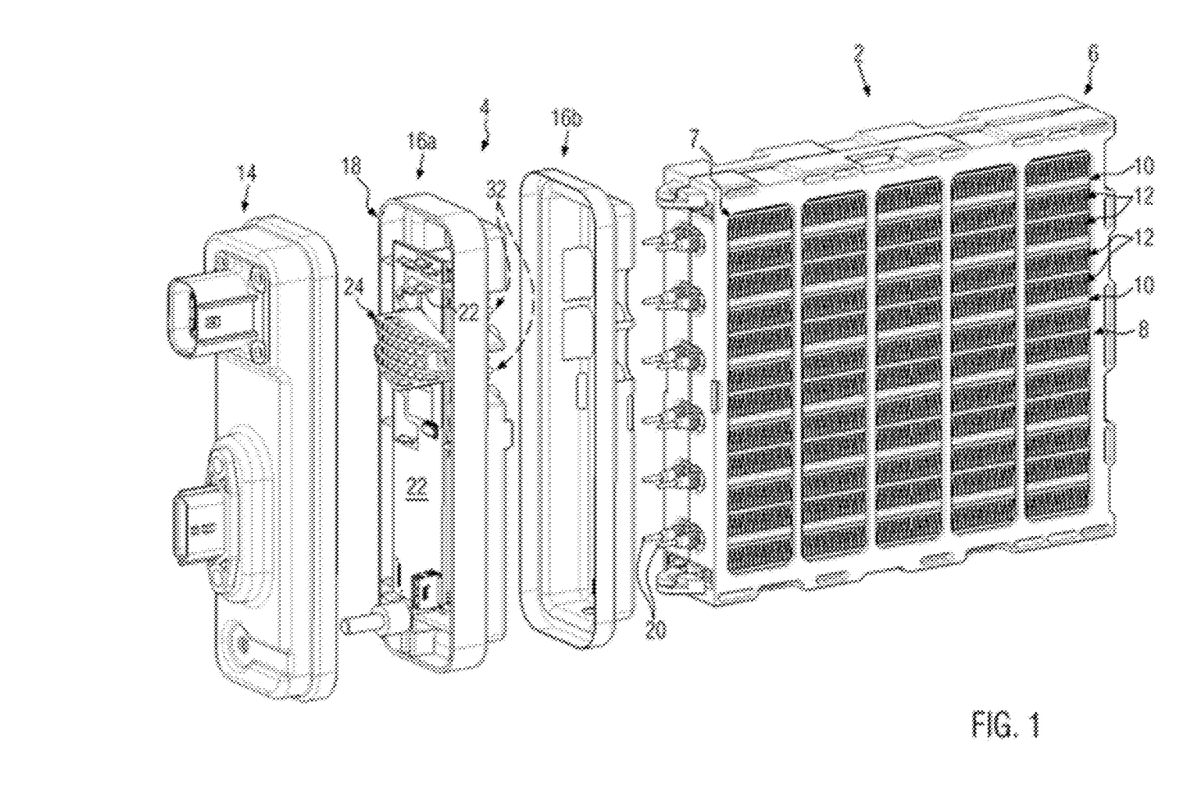
FIG. 1 shows a perspective side view of an embodiment of an electric heating device with the electric control device according to the invention.

The control device 4 comprises a control housing with a housing cover 14 and a two-part housing base 16a, b. The control housing surrounds a connection chamber 18 for contact elements 20 of the PTC heating devices 10 projecting beyond the frame 6 on one side, which project into the connection chamber 18 and are electrically connected there. The electric control device 4 has an equipped printed circuit board 22 which is electrically contacted with a connection printed circuit board not shown in detail, as is known in principle from EP 2 607 121 A1. A power switch 26 is located at the level of a pressure element characterized by reference sign 24, which is partially accommodated in a bore 28 of the equipped printed circuit board 22 and partially projects beyond it in the direction of the power section. In the assembled state shown in FIG. 2, the pressure element 24 abuts against an upper side of the power switch 26. On the opposite side of the power switch 26, a partition wall 30 formed by the housing base 16 forms cooling fins 32 projecting toward the power section. On the inner surface of the partition wall 30 opposite the cooling fins 32, the partition wall 30 forms a surface which is characterized by reference sign 34 and serves to introduce the power dissipation of the power switch 26 into the cooling fins 32. The cooling fins 32 are thereby heat sinks within the meaning of the present invention.

Figure 2:
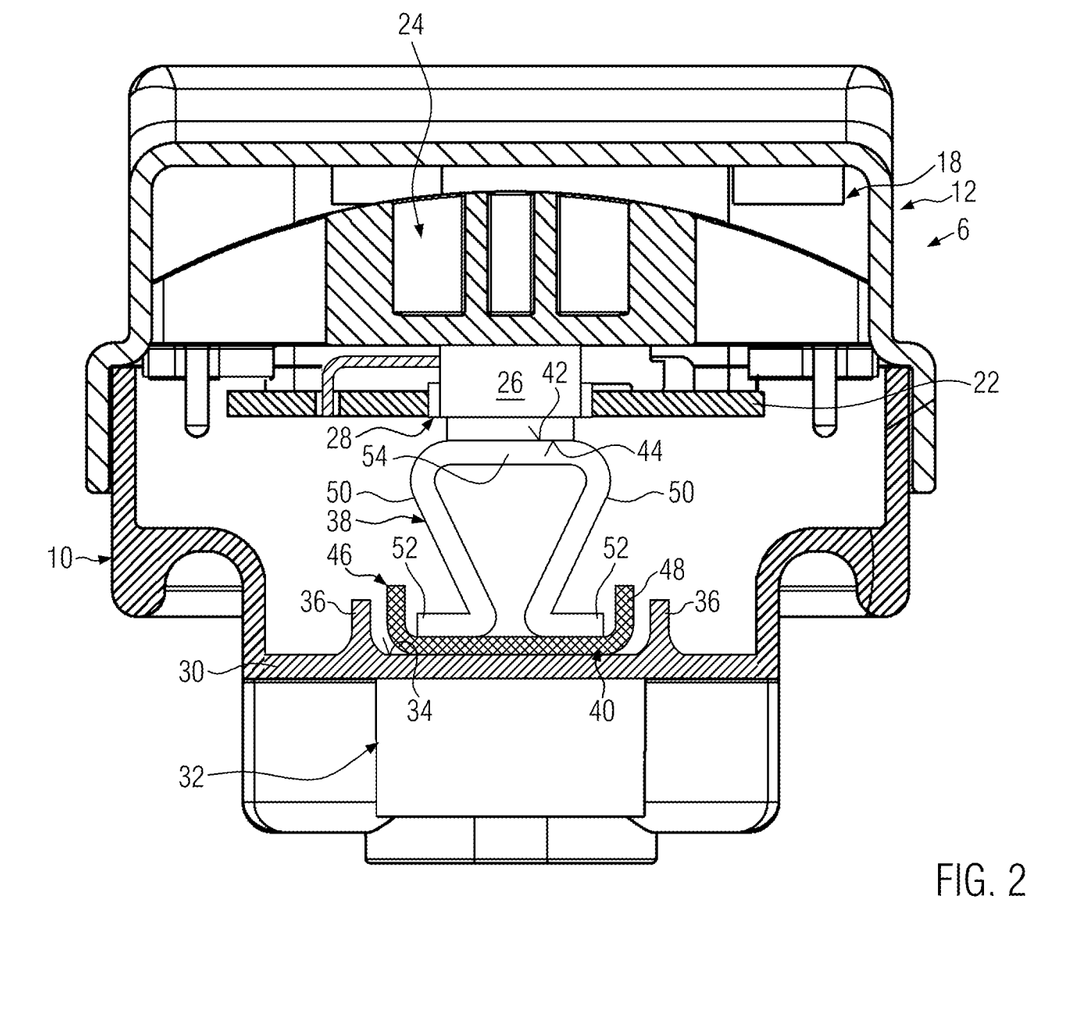
FIG. 2 shows a sectional view along line II-II as shown in FIG. 1.

Walls 36, which are integrally formed on the housing base 16, project from the partition wall 30 and surround the surface 34 at least partially, or even completely. Even a partial circumferential surrounding of the surface 34 by the walls 36 effectively limits the movability of a spring element 38 or an insulating layer 40 transversely to the surface 34.

In the embodiment shown, the spring element 38 abuts with its contact surface, characterized by reference sign 42, against a contact surface 44 of the power switch 26 under pretension. On the side opposite the contact surface 44 of the power switch 26, the spring element 38 is supported by the insulating layer 40. In the present case, the insulating layer 44 is formed by a trough-shaped insulating form-fit element 46, which covers the walls 36 circumferentially on the inside and is movable between the walls 36 with a certain amount of play transverse to the direction of action of the spring force generated by the spring element 38. The insulating form-fit element 46 forms insulating walls 48 which surround the spring element 38 circumferentially and project partially in the direction of action of force of the spring pretensioning force. This prevents the spring element 38 from coming into direct contact with the walls 36. The insulating form-fit element 46 is presently formed from a Kapton film/polyimide film.

On the opposite side, the spring element 38 is in direct contact with the power switch 26. However, the two components 26, 38 are slidably displaceable relative to each other. Thus, the spring element 38 can be displaced transversely to the direction of action of the spring pretensioning force relative to the power switch 26.

Figure 3:
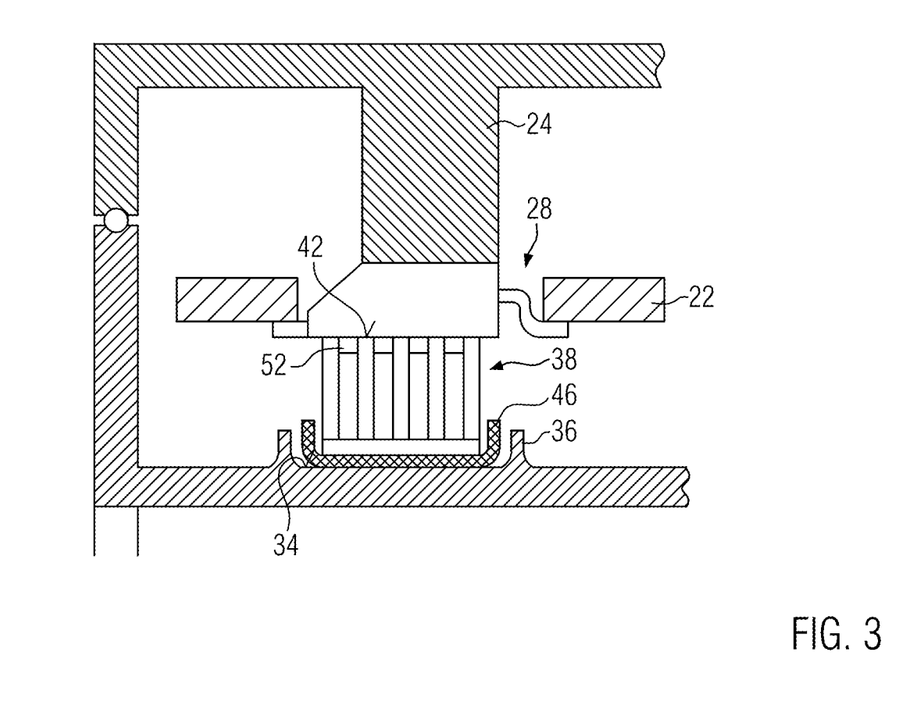
FIG. 3 shows a sectional view at right angles to the illustration in FIG. 2 for the detail shown in FIG. 2 with schematized illustration of the components.

As FIG. 3 illustrates, the spring element has spring segments 50 which extend from opposite edges of the contact surface 42 and, in a side view, define a U- or V-shaped configuration of the spring element. The spring element 38 shown in FIGS. 2 and 3 is U-shaped in the view according to FIG. 3, wherein the free ends of the spring segments 50 are bent towards each other and are provided with an outwardly widened foot 52, via which the spring element 38 abuts relatively flush against the insulating form-fit element 46. The contact surfaces formed by the feet 52 are, as the contact surface 42 of the spring element 38, substantially planar.

FIG. 3 illustrates that several such U-shaped spring segments 50 are provided one behind the other in the longitudinal direction of the spring element 38. These spring segments 50 are each connected to one another via a base of the spring element 38 characterized by reference sign 54, which forms the contact surface 42.

For assembly, the insulating form-fit element 46 is placed on the surface 34 of the partition wall 30. Then, the spring element 38 is placed inside the insulating form-fit element 46. Thereafter, the previously assembled circuit board 22 provided with the power switch 26 is inserted into the trough-shaped housing base 16 so that the power switch 26 is applied against the contact surface 42 of the base 54. The pressure element 24 is then bolted to the housing base 16, thereby elastically deforming the spring element 28 and subjecting it to pretension. At the end of this assembly, the power switch 26 is applied under pretension against the surface 34, with the spring element 38 and the insulating layer 40 in the heat conduction path to the cooling fin 32. Thereafter, the housing cover 14 is usually mounted to seal the components accommodated in the control device from the environment.

Figure 4:
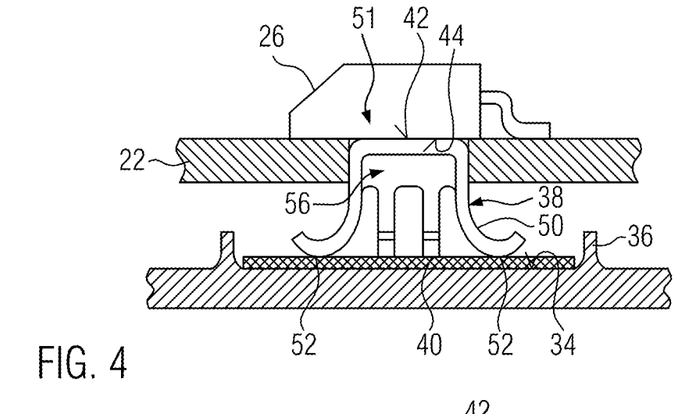
FIG. 4 shows a sectional view corresponding to FIG. 2 for an alternative configuration.

FIG. 4 shows a variant. In this respect, the illustration according to FIG. 4 is limited to the essential components of the embodiment.

The same components are characterized by the same reference signs as in the preceding description.

Figure 5:
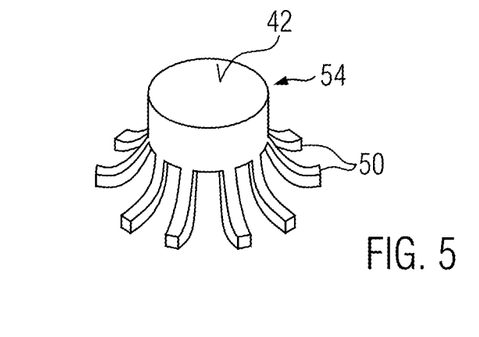
FIG. 5 shows a perspective side view of the spring element of the alternative configuration and FIG. 6 shows a perspective, exploded side view of a PTC heat device of the electrical heating device illustrated in FIG. 1.

In the embodiment shown in FIGS. 4 and 5, the contact surface 42 of the spring element is basically circular. A cylindrical cup section 56 of the spring element 38 extends first at right angles to the contact surface 42 and is accommodated in the bore 28 of the printed circuit board 22. Spring segments 50, which project radially from the base 54, also extend from this cup section 56 at their free ends. These are convexly curved at their free ends so that the foot 52 abuts against the insulating layer 40 with a convexly curved contact surface. This is formed as a planar foil. The foil lines the entire area of the surface 34 between the walls 36. The power switch 26 is soldered to the contact surface 42 of the spring element 38. In this embodiment, too, a pressure element 24, which is only indicated, is provided to elastically pretension the spring element 38 during assembly.

Figure 6:
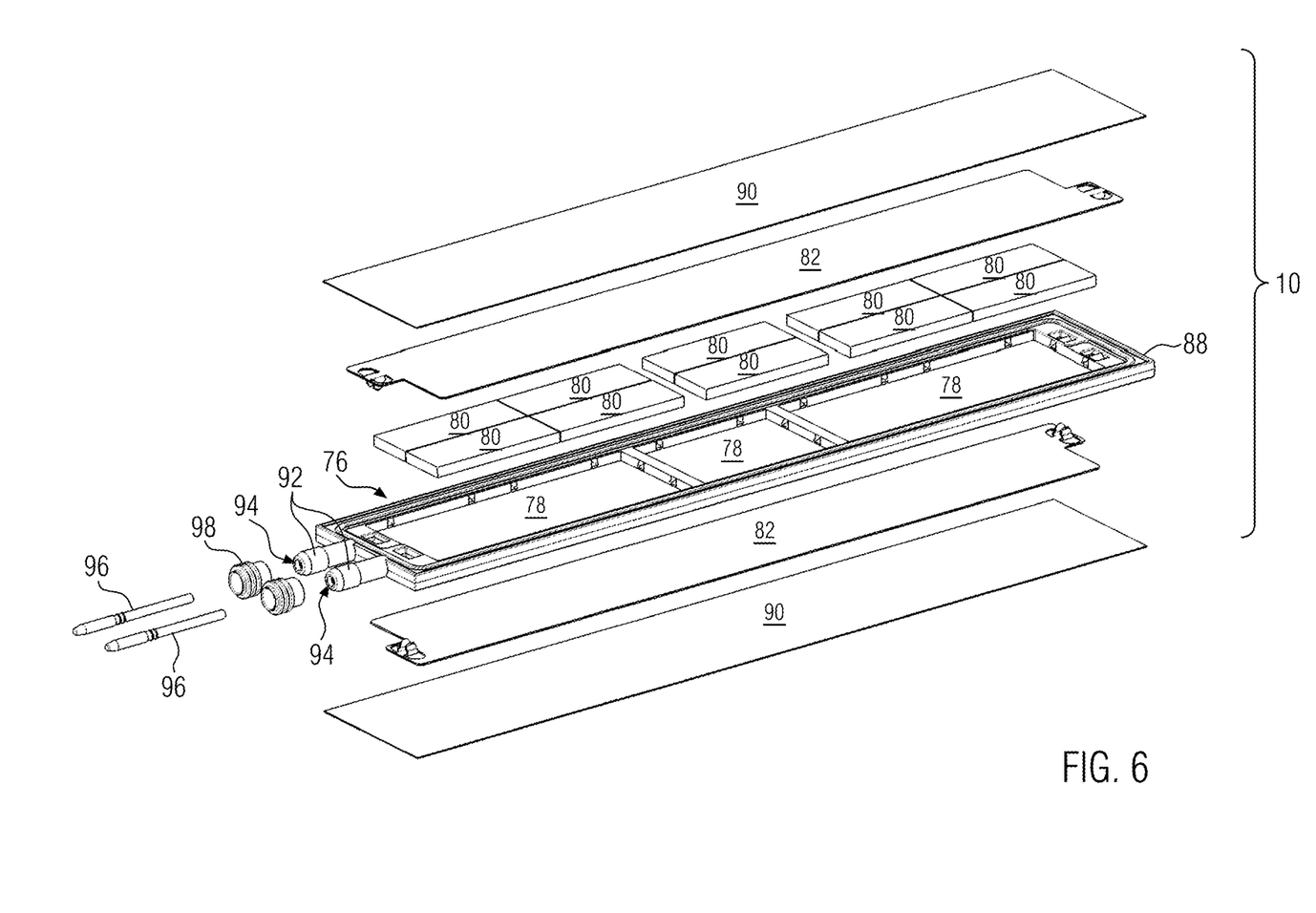

As can be seen especially from FIG. 6, the PTC heating device 10 consists of several layers lying one above the other. The PTC heating device 10 is essentially constructed symmetrically, whereby a positional frame labelled with the reference numeral 76 and made from an electrically insulating material, in particular plastic, is provided in the centre. The positional frame 76 forms in the present case three receptacles 78 for PTC elements 80. Conductor elements 82 in form of contact plates abut oppositely situated sides of the PTC elements 80. These two conductor elements 82 are formed identically and punched out from electrically conducting sheet metal. The conductor elements 82 are placed on the ceramic PTC elements 80 as separate elements. They can be additionally provided with a vapour deposited electrode layer, as generally normal. The electrode layer is however not a conductor elements 82 for the purpose of the invention.

At approximately the height of the conductor elements 82 the positional frame 76 forms a circumferential sealing groove into which elastomeric adhesive edging 88 is filled as annular beading. This adhesive edging 88 surrounds all the receptacles 78 fully circumferentially and is used for the adherence of an insulating layer with the reference numeral 90, which in the present case is formed from an insulating plastic film and which extends up to a marginal region of the positional frame 76, in any case in the circumferential direction protruding over the adhesive edging 88 with excess. Due to joining the insulating layer 90 with the positional frame 76, facilitated by the adhesive edging 88, the receptacle 78 and the conductor elements 82 are hermetically sealed with respect to the outer circumference.

Access to the interior of the positional frame 76 is solely given on the face side of the positional frame 76 and by connection pieces 92 which are formed as one part from its material and which fully circumferentially surround a channel 94 for accommodation of pin-shaped contact elements 96. On their free ends the connection pieces 92 bear sealing elements 98, formed from a thermoplastic elastomer or from PTFE, with a labyrinth type of sealing structure, which can be joined to the associated connection pieces 92 by overmoulding or plugging on. On the face side of each positional frame 76 two connection pieces 92 with identical embodiment and sealing are provided for the accommodation of two contact pins 96 for electrically contacting the conductor elements 82.

The invention claimed is:

1. An electric heating device comprising:
   a power section including a frame forming a heating chamber;
   an electric control device comprising a control housing;
   at least one PTC heating device provided in the heating chamber, the PTC heating device including at least one PTC element and conductor elements for energizing the PTC element with different polarities, wherein
   the control housing forms a chamber which is separated from the frame by a partition wall, wherein a heat sink projects from the partition wall toward the power section, wherein
   the electric control device has a printed circuit board and at least one power switch which generates heat and which is connected, in a heat-conducting manner, to a surface of the heat sink, and wherein
   an electrically insulating layer and a spring element are provided between the power switch and the heat sink, wherein
   the spring element is configured to hold the power switch and heat sink in place under a pretensioning force, wherein
   the spring element being formed of a spring material with good heat-conducting properties, and wherein
   the heat produced by the power switch is exclusively conducted between the power switch and the heat sink via the spring element.

2. The electric heating device according to claim 1, wherein the wall is configured to limit the movability of the electric insulating layer in a direction transverse to a direction of action of force of the pretensioning force that is imposed by the spring element.

3. The electric heating device according to claim 1, further comprising a form-fit segment which is connected to the surface of the heat sink, wherein the form-fit segment is configured to limit the movability of the spring element in a direction transverse to a direction of action of the pretensioning force imposed by the spring element.

4. The electric heating device according to claim 2, wherein the wall is provided integrally on a cooling element body forming the heat sink.

5. The electric heating device according to claim 1, wherein the wall is provided integrally on a cooling element body forming the heat sink.

6. The electric heating device according to claim 1, wherein the insulating layer is formed by an insulating form-fit element held in a form-fitting manner on the surface of the heat sink.

7. The electric heating device according to claim 1, wherein the spring element comprises at least two spring segments and has a U- or V-shaped configuration in a side view, and wherein the free ends of the spring segments are displaceable on the insulating layer.

8. The electric heating device according to claim 1, wherein a contact surface of the spring element abuts the power switch in a slidably displaceable manner relative thereto.

9. The electric heating device according to claim 8, wherein a contact surface of the power switch is supported on the spring element and projects beyond the printed circuit board toward the heat sink.

10. The electric heating device according to claim 8, wherein the contact surface of the spring element is firmly connected to the power switch.

11. The electric heating device according to claim 10, wherein the spring element is at least partially accommodated in a bore of the printed circuit board.

12. The electric heating device according to claim 1, wherein the spring material is beryllium.

13. The electrical heating device according to claim 1, wherein a pressure element applies the power switch against the spring element on a side opposite the heat sink.

14. The electrical heating device according to claim 1, wherein the printed circuit board has a bore in which the power switch or the spring element is accommodated.

15. An electric heating device comprising:
   a power section including a frame forming a heating chamber;
   an electric control device comprising a control housing;
   at least one PTC heating device provided in the heating chamber, the PTC heating device including at least one PTC element and conductor elements for energizing the PTC element with different polarities, wherein
   the control housing forms a chamber which is separated from the frame by a partition wall, wherein a heat sink projects from the partition wall toward the power section, wherein the electric control device has a printed circuit board and at least one power switch which generates heat and which is connected, in a heat-conducting manner, to a surface of the heat sink, wherein an electrically insulating layer and a spring element are provided between the power switch and the heat sink, wherein the spring element is configure configured to hold the power switch and heat sink in position under a pretensioning force, and wherein a wall projecting from the partition wall is configured to limit the movability of the electric insulating layer in a direction transverse to a direction of action of the pretensioning force imposed by the spring element.

16. The electric heating device according to claim 15, wherein the wall is provided integrally on a cooling element body forming the heat sink.

17. An electric heating device comprising:

a power section including a frame forming a heating chamber;

an electric control device comprising a control housing;

at least one PTC heating device provided in the heating chamber, the PTC heating device including at least one PTC element and conductor elements for energizing the PTC element with different polarities, wherein the control housing forms a chamber which is separated from the frame by a partition wall, wherein a heat sink projects from the partition wall toward the power section, wherein the electric control device has a printed circuit board and at least one power switch which generates heat and which is connected, in a heat-conducting manner, to a surface of the heat sink, wherein an electrically insulating layer and a spring element are provided between the power switch and the heat sink, wherein the spring element is configured to hold the power switch and heat sink in position under a pretensioning force, and wherein a pressure element applies the power switch against the spring element on a side opposite the heat sink.

18. The electric heating device according to claim 17, further comprising a wall projecting from the partition wall, wherein the wall is configured to limit the movability of the electric insulating layer in a direction transverse to a direction of action of the pretensioning force imposed by the spring element.

19. The electric heating device according to claim 17, further comprising a wall projecting from the partition wall, wherein the wall is configured to limit the movability of the spring element in a direction transverse to a direction of action of the pretensioning force imposed by the spring element.

* * * * *